(12) United States Patent
Troost et al.

(10) Patent No.: US 7,499,146 B2
(45) Date of Patent: Mar. 3, 2009

(54) LITHOGRAPHIC APPARATUS AND DEVICE MANUFACTURING METHOD, AN INTEGRATED CIRCUIT, A FLAT PANEL DISPLAY, AND A METHOD OF COMPENSATING FOR CUPPING

(75) Inventors: Kars Zeger Troost, Waalre (NL); Johannes Jacobus Matheus Baselmans, Oirschot (NL); Arno Jan Bleeker, Westerhoven (NL); Louis Markoya, Sandy Hook, CT (US); Neal Callan, Lake Oswego, OR (US); Nicholas K. Eib, San Jose, CA (US)

(73) Assignees: ASML Netherlands B.V., Veldhoven (NL); ASML Holding N.V., Veldhoven (NL); LSI Logic Corporation, Milpitas, CA (US)

( * ) Notice: Subject to any disclaimer, the term of this patent is extended or adjusted under 35 U.S.C. 154(b) by 429 days.

(21) Appl. No.: 11/252,877

(22) Filed: Oct. 19, 2005

(65) Prior Publication Data

US 2006/0203220 A1    Sep. 14, 2006

Related U.S. Application Data

(63) Continuation of application No. 11/078,711, filed on Mar. 14, 2005, now abandoned.

(51) Int. Cl.
G03B 27/54 (2006.01)
G03B 27/42 (2006.01)
(52) U.S. Cl. .......................................... 355/67; 355/53
(58) Field of Classification Search .................. 355/53, 355/55, 67; 359/291–292
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |

(Continued)

FOREIGN PATENT DOCUMENTS

| | | |
|---|---|---|
| WO | WO 98/33096 | 7/1998 |
| WO | WO 98/38597 | 9/1998 |

*Primary Examiner*—Diane Lee
*Assistant Examiner*—Hung Henry Nguyen
(74) *Attorney, Agent, or Firm*—Sterne, Kessler, GOldstein & Fox P.L.L.C.

(57) ABSTRACT

The tilt and position of individually controllable element are simultaneously adjusted to allow a greater range of contrasts to be achieved. This can also be used to compensate for cupping of individually controllable elements. Simultaneous adjustment of both the position and tilt of the individually controllable elements can be achieved by two electrodes operable over a range of values.

19 Claims, 6 Drawing Sheets

U.S. PATENT DOCUMENTS

| | | | |
|---|---|---|---|
| 6,965,119 B2* | 11/2005 | Sandstrom et al. | 250/559.1 |
| 7,167,298 B2* | 1/2007 | Pan | 359/291 |
| 2004/0041104 A1 | 3/2004 | Liebregts et al. | |
| 2004/0130561 A1 | 7/2004 | Jain | |
| 2005/0007572 A1 | 1/2005 | George et al. | |
| 2005/0074906 A1* | 4/2005 | Kochersperger | 438/7 |

\* cited by examiner

LITHOGRAPHIC APPARATUS AND DEVICE MANUFACTURING METHOD, AN INTEGRATED CIRCUIT, A FLAT PANEL DISPLAY, AND A METHOD OF COMPENSATING FOR CUPPING

CROSS REFERENCE TO RELATED APPLICATIONS

This application is a continuation of U.S. application Ser. No. 11/078,711, filed Mar. 14, 2005, which is incorporated by reference herein in its entirety.

BACKGROUND

1. Field

The present invention relates to a lithographic apparatus and a method for manufacturing a device.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), micro-electro-mechanical-systems (MEMS), and other devices involving fine structures. In a conventional apparatus, a contrast device or a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. An advantage of such a system compared to a mask-based system is that the pattern can be changed more quickly and for less cost.

In general, a flat panel display substrate is rectangular in shape. Known lithographic apparatus designed to expose a substrate of this type typically provide an exposure region, which covers a full width of the rectangular substrate, or which covers a portion of the width (e.g., about half of the width). The substrate is scanned underneath the exposure region, while the mask or reticle is synchronously scanned through the beam. In this way, the pattern is transferred to the substrate. If the exposure region covers the full width of the substrate, then exposure is completed with a single scan. If the exposure region covers, for example, half of the width of the substrate, then the substrate is moved transversely after the first scan, and a second scan is performed to expose the remainder of the substrate.

Another way of imaging includes pixel grid imaging, in which a pattern is realized by successive exposure of spots.

The individually controllable elements can be controlled in one of two ways: (1) by controlling the tilt of the individually controllable element or (2) by controlling the position (in a direction perpendicular to the plane of the individually controllable elements) of the individually controllable elements. The tilt of the individually controllable element can be used to deflect a portion of the radiation beam either towards the substrate or away from the substrate. The position of the individually controllable element can be used to change the path length of a portion of the radiation beam and create destructive interference. Each of these methods has different advantages. For example, adjusting the position of the mirrors allows for imparting any phase to the reflected beam and thus allows emulation of any type of mask (e.g., binary masks, attenuated phase shift masks, masks with any phase e.g. vortex masks, etc.), while adjusting the tilt yields a reflected intensity either in phase or (with a certain limited amplitude) of exactly opposite phase to the incoming beam.

Therefore, what is needed is a system and method that using the beneficial effect of adjusting both the tilt and position of an individually controllable element.

SUMMARY

One embodiment of the present invention provides a lithographic apparatus comprising an illumination system, a patterning array, a projection system. The illumination system is configured to condition a radiation beam. The patterning array comprises individually controllable elements capable of modulating the cross-section of the radiation beam. The projection system is configured to project the modulated radiation beam onto a target portion of a substrate. The patterning array comprises a device constructed to simultaneously adjust the linear position and tilt of each of the individually controllable elements.

Another embodiment of the present invention provides a device manufacturing method comprising modulating a beam of radiation using an array of individually controllable elements, projecting a modulated beam of radiation onto a substrate, and simultaneously adjusting a position and a tilt of each of the individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

The present invention will now be described with reference to the accompanying drawings. In the drawings, like reference numbers can indicate identical or functionally similar elements.

DETAILED DESCRIPTION

Overview and Terminology

Figure 1:
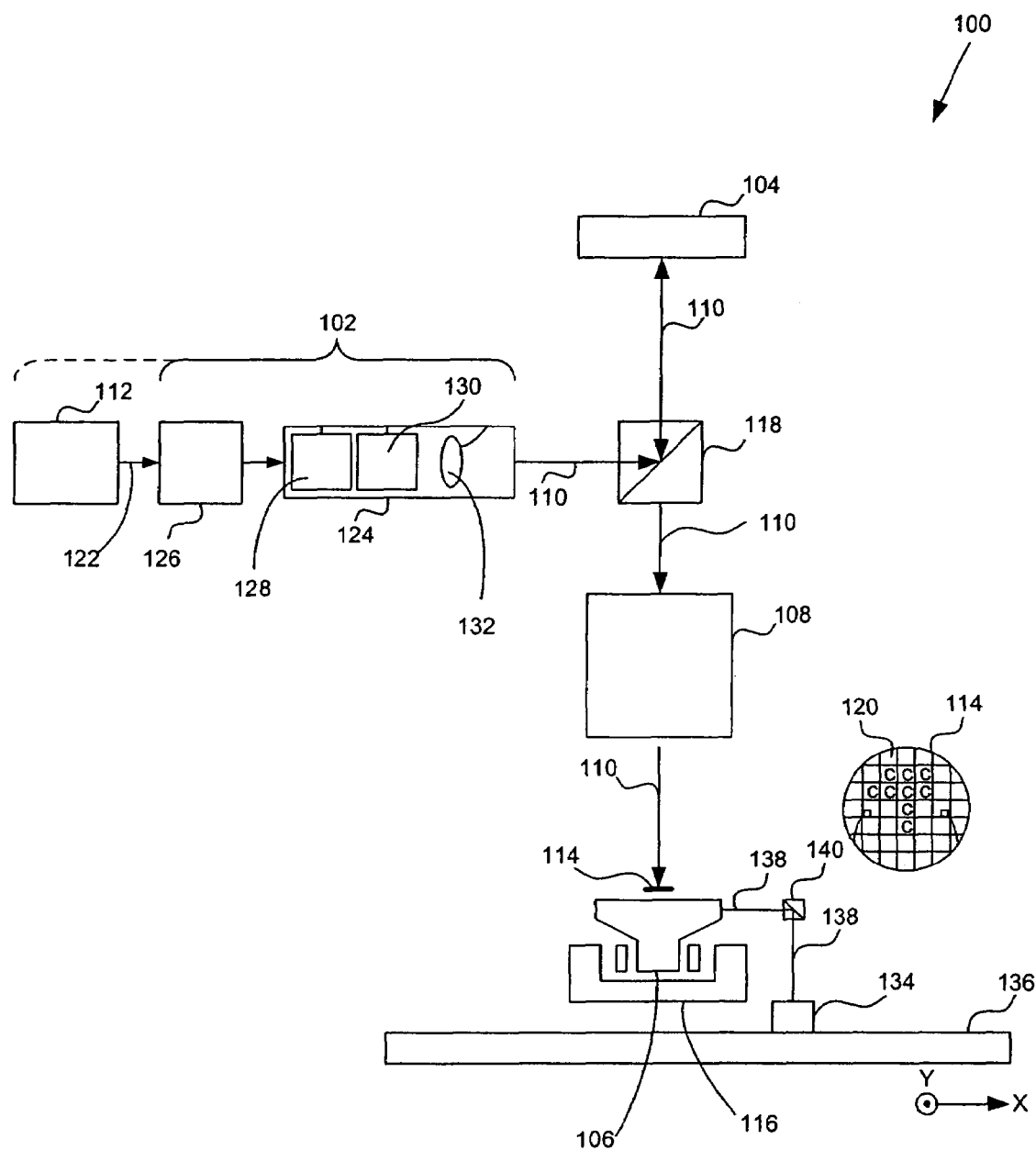
FIG. 1 depicts a lithographic apparatus, according to one embodiment of the invention.

The terms "contrast device," "patterning device," "patterning array," or "array of individually controllable elements" used herein should be broadly interpreted as referring to any device that can be used to modulate the cross-section of a radiation beam such as to create a pattern in a target portion of the substrate. It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include:

A programmable mirror array. This can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

A programmable LCD array is another example. Programmable LCD arrays are described in, for example, U.S. Pat. No. 5,229,872, which is incorporated herein by reference in its entirety.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g. to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g. water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In another example, the invention can take the form of a computer program containing one or more sequences of machine-readable instructions describing a method as disclosed above, or a data storage medium (e.g. semiconductor memory, magnetic or optical disk) having such a computer program stored therein.

Exemplary Environment

FIG. 1 schematically depicts a lithographic projection apparatus 100, according to one embodiment of the present invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation, 248 nm, 193 nm, 157 nm, etc.), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or CaF$_2$ lens system or a catadioptric system comprising lens elements made from such materials, or a mirror system) can be used for projecting the patterned beam received from a directing device 118 (e.g., beam splitter).

Light is directed from directing device 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters.

In an imaging grid array embodiment, projection system 108 can also comprise a micro lens array (MLA) to form the secondary sources and to project microspots onto substrate 114. For example, see FIG. 2.

Source 112 (e.g., a frequency tripled Nd:YAG laser in pixel grid imaging mode or an excimer laser in other modes) can produce a beam of radiation 122. Beam 122 is fed into an illumination system (e.g., illuminator) 124, either directly or after having traversed conditioning device 126, such as a beam expander, for example.

In one example, when apparatus 100 is operating in a pixel grid imaging mode, illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

In another example, when apparatus 100 is operating in other modes, illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components. In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using directing device 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

In these first four exemplary modes, "partial coherent imaging" is typically performed for integrated circuit formation. Using this imaging, each element in an array of individually controllable elements has a unique tilt. The array is positioned at the object plane and the substrate is positioned at the image plane of the imaging projection optics. Various illumination modes can be applied: annular, conventional, quadrupole, dipole etc. Also, different configurations can be used to increase the "negative black" values: phase step mirrors, applying larger tilts, shaping the mirrors (butterfly, H-shape), or the like.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied. In this mode, which is typically used for formation of flat panel displays, individually controllable elements can be grouped into super-pixels. One super-pixel modulates the light of one spot at the substrate. The super-pixel is imaged at the entrance of an MLA in the exit pupil of each spot printed. The spot shape can be influenced by the illuminator through use of spot defining element (e.g., spot generators), zoom of blazing functions, or the like.

Combinations and/or variations on the above described modes of use or entirely different modes of use can also be employed.

Figure 2:
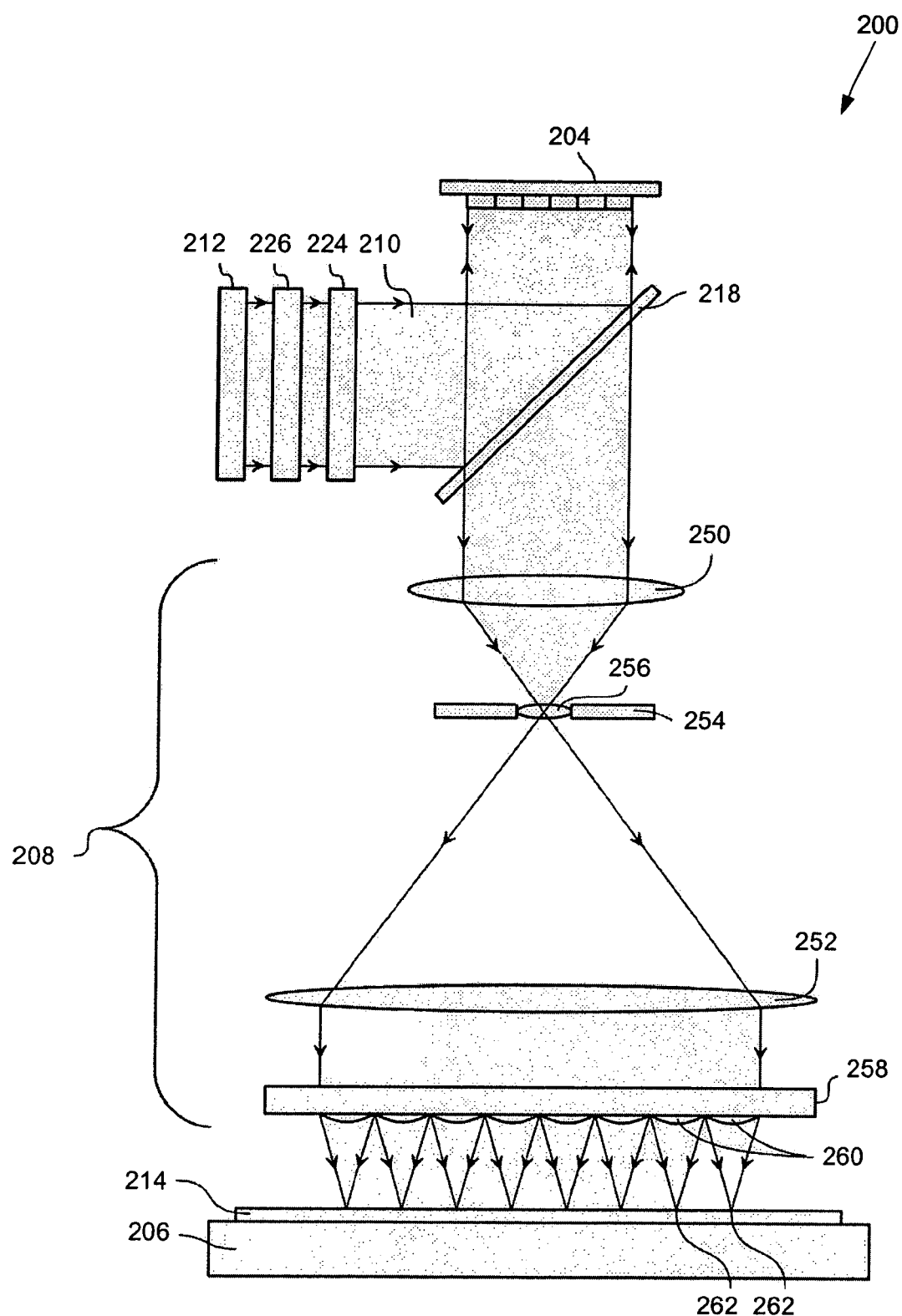
FIG. 2 depicts a lithographic apparatus that can be used, for example, in the manufacture of a flat panel display, according to one embodiment of the present invention.

FIG. 2 depicts a lithographic apparatus 200, according to one embodiment of the present invention. For example, apparatus 200 can be especially useful in the manufacture of flat panel displays using the pixel grid imaging mode discussed above.

As shown in FIG. 2, projection system 208 includes a beam expander, which comprises two lenses 250 and 252. First lens 250 is arranged to receive a modulated radiation beam 210 and focus it through an aperture in an aperture stop 254. In one example, a lens 256 is located in the aperture. Radiation beam 110 then diverges and is focused by second lens 252 (e.g., a field lens).

Projection system 208 further comprises an array of lenses 258 (e.g., a microlens array (MLA)) arranged to receive expanded modulated radiation 110. Different portions of the modulated radiation beam 110, corresponding to one or more of the individually controllable elements in a patterning or contrast device 204, pass through respective lenses 260 in MLA 258. Each lens 260 focuses the respective portion of the modulated radiation beam 110 to a point which lies on a substrate 214. In this way, an array of radiation spots 262 are exposed onto substrate 214. Although only eight lenses 260 are shown, MLA 258 can comprise many thousands of lenses, which is also true of a number of individually controllable elements in the array of individually controllable elements used as patterning or contrast device 204.

Figure 3:
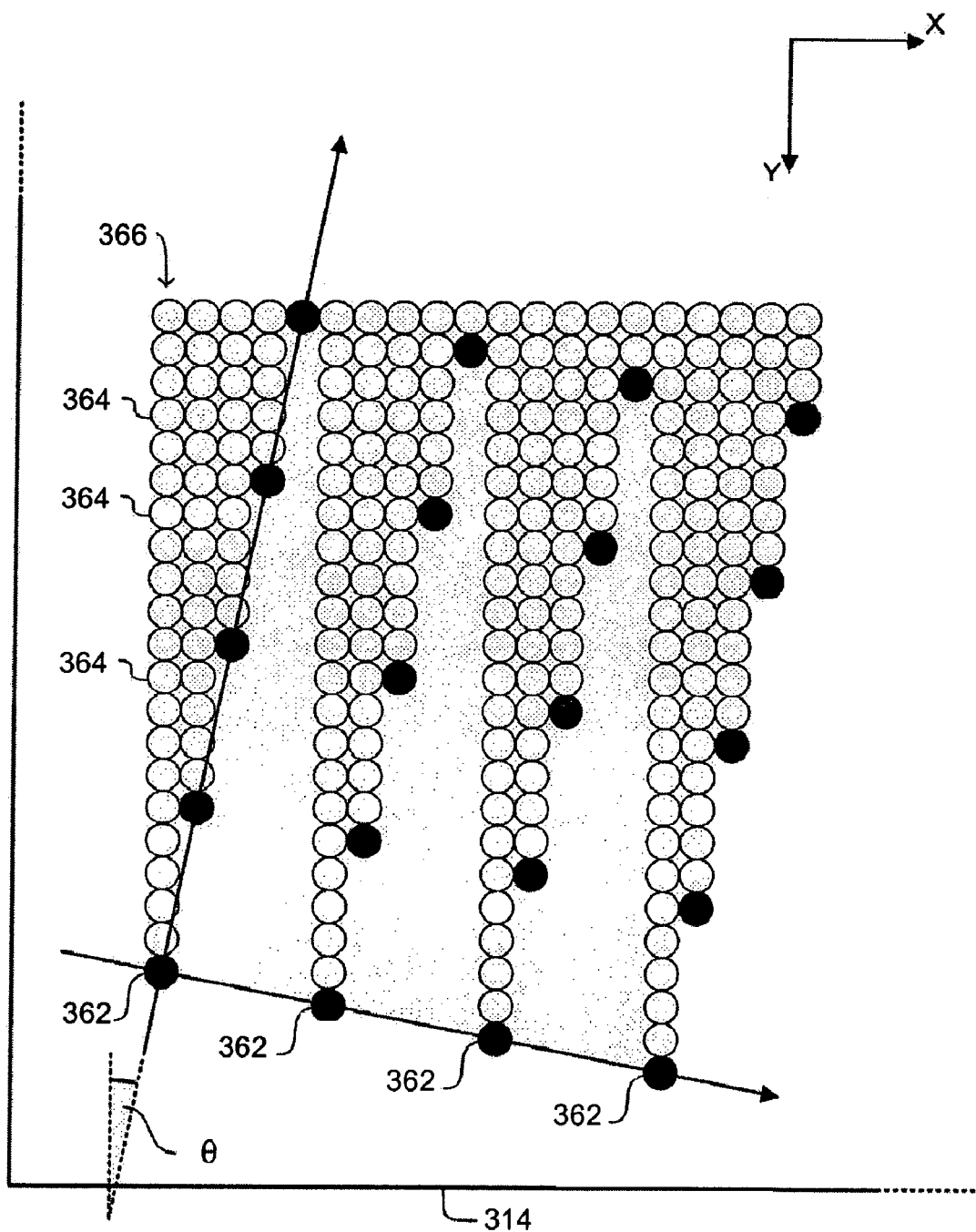
FIG. 3 depicts a mode of transferring a pattern to a substrate using a lithographic apparatus, according to one embodiment of the present invention.

FIG. 3 illustrates schematically how a pattern on a substrate 314 is generated, according to one embodiment of the present invention. For example, this embodiment can be performed using pixel grid imaging.

The darkened circles 362 represent spots recently projected onto substrate 314 by a MLA in a projection system, for example the projection system as shown in FIG. 2. Substrate 314 is moved relative to the projection system in a Y direction as a series of exposures are exposed on substrate 314.

The open circles 364 represent spots that have previously been exposed on substrate 314. As shown, each spot 362 projected onto substrate 314 using the array of lenses within the projection system exposes a row 366 of spot exposures 362/364 on substrate 314. The complete pattern for substrate 314 is generated by the sum of all the rows 366 of spot exposures 364 exposed by each of the spots 362. Such an arrangement is commonly referred to as "pixel grid imaging," which was discussed above.

It can be seen that the array of radiation spots 362 is arranged at an angle θ relative to substrate 314 (i.e., when the edges of the substrate 314 lie parallel to the X and Y directions). This is done so that when substrate 314 is moved in a scanning direction (e.g., the Y-direction), each radiation spot 362 will pass over a different area of substrate 314, thereby allowing the entire substrate to be covered by the array of radiation spots. It will be appreciated that for ease of illustration the angle θ is exaggerated in FIG. 3.

It is to be appreciated that although 5×5 spots are shown in between two neighboring spots of the MLA, in one example up to about 100×100 spots can be used.

In one example, a spot grid at a substrate is about half a minimum linewidth to be printed (e.g., from about 0.1 microns up to a few microns), while a spot pitch at a MLA is about 100 micrometers up to about a few hundred micrometers.

Figure 4:
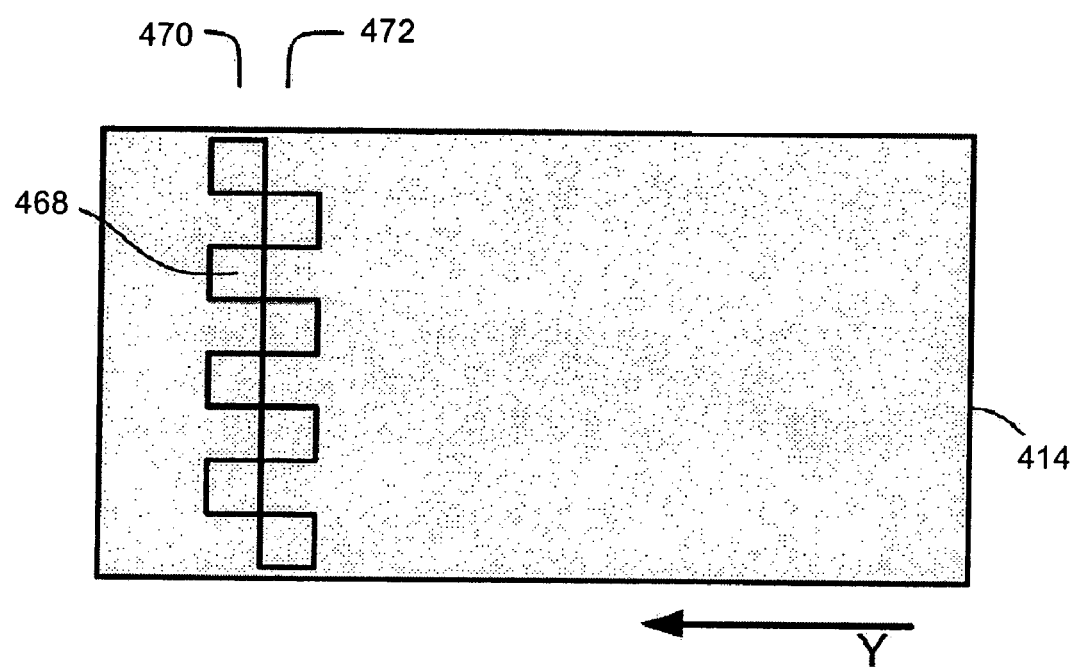
FIG. 4 depicts an arrangement of optical engines for exposing a pattern on a substrate, for example, used to manufacture a flat panel display, according to one embodiment of the present invention.

FIG. 4 shows schematically how an entire flat panel display substrate 414 is exposed in a single scan through use of a plurality of optical engines, according to one embodiment of the present invention. Eight arrays 468 of radiation spots are produced by eight optical engines (not shown), arranged in two rows 470,472 in a "chess board" configuration, such that the edge of one array of radiation spots slightly overlaps (e.g., in the scanning direction Y) with the edge of the adjacent array of radiation spots. In this example, a band of radiation extends across a width of substrate 414, allowing exposure of the entire substrate to be performed in a single scan. It will be appreciated that any suitable number of optical engines can be used.

In one example, each optical engine can comprise a separate illumination system, patterning device, and/or projection system, as described above. It is to be appreciated, however, that two or more optical engines can share at least a part of one or more of the illumination system, patterning device, and projection system.

Figure 5A:
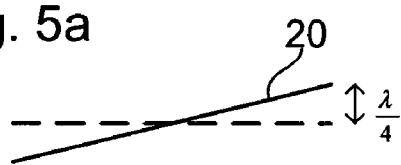
FIGS. 5A, 5B and 5C show different positions of an individually controllable element, according to one embodiment of the present invention.
Figure 5B:
Figure 5C:

FIGS. 5A, 5B and 5C show different positions of an individually controllable element, according to one embodiment of the present invention.

FIG. 5A shows the tilt of an individually controllable element 20 being adjusted to result in a path difference of λ/2 (lambda divided by two, where λ=the wavelength of light used) thus yielding a reflected intensity of zero.

FIG. 5B shows the position of an individually controllable element 20 being adjusted to result in a path difference of λ/2.

FIG. 5C shows both the tilt and position of the mirror being adjusted. In this embodiment, the combined adjustment of both the tilt and position of the individually controllable elements leads to a more desirable range of contrast greater than adjusting just one, and the contrast can be adjusted in a more linear fashion.

Figure 6:
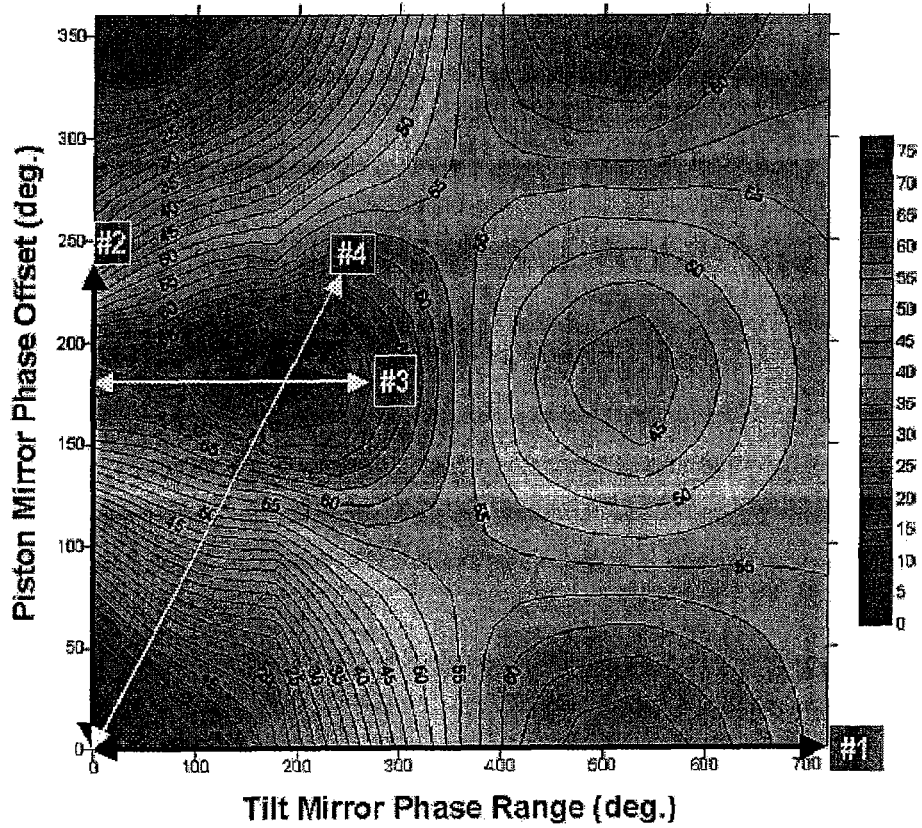
FIG. 6 shows a range of contrast resulting from different adjustments to an individually controllable element, according to one embodiment of the present invention.

FIG. 6 shows a range of contrast resulting from different adjustments to an individually controllable element 20, according to one embodiment of the present invention. Adjusting just the tilt of the individually controllable element (following trajectory 1) leads to a limited range of contrast, as does adjusting solely the position of the individually controllable element 20 (following trajectory 2). However, if both the tilt and position of the mirror 20 are adjusted (following trajectory 4) a greater range of contrast can be achieved. Furthermore, adjusting both the tilt and position simultaneously results in a substantially linear adjustment in the contrast.

Figure 7:
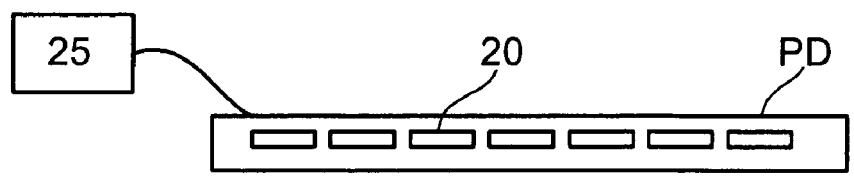
FIG. 7 shows a patterning apparatus, according to one embodiment of the present invention.

FIG. 7 shows a patterning apparatus PD, according to one embodiment of the present invention. Individually controllable elements 20 forming the patterning means PD are controlled/adjusted by a controller/adjusting device 25 that ensures that the tilt and position of the individually controllable elements 20 are simultaneously adjusted in a linear fashion. For example, see trajectory 4 in FIG. 6.

In one example, the adjusting device 25 has a range of tilt adjustment of an angle range of at least 3λ/2L rad, wherein L is a length of the individually controllable element and λ is a wavelength of the beam of radiation. In another example, the adjusting device 25 also simultaneously adjusts a linear position linearly in range of λ, a wavelength of the beam of radiation, and adjusts the tilt over an angle range of λ/L rad.

In one example, a single control signal controls the adjusting device 25, such as to maximize a range of intensities generated by each of the individually controllable elements FIGS. 8, 9, 10, and 11 show various aspects of an individually controllable element, according to one embodiment of the present invention.

Figure 8:
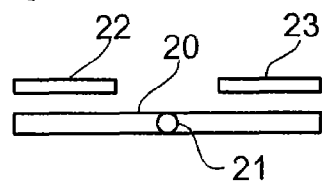
FIGS. 8, 9, 10, and 11 show various aspects of an individually controllable element, according to one embodiment of the present invention.

FIG. 8 shows an adjustment of both the tilt and position of the individually controllable elements 20 using two electrodes 22, 23 on either side of a hinge 21 bisecting the individually controllable element 20. Each electrode 22, 23 is operable over a range of values, i.e., the each electrode is capable of providing a plurality of grayscales. For example, if both electrodes are operable over a range of values 1 to 100 and both electrodes are operated at 50 (as shown in FIG. 5B) the position of the individually controllable element 20 will change. In another example, if one electrode is operated at 50 and the other at 0 a tilt will result (as shown in FIG. 5A). In yet another example, if one electrode is operated at 100 and the other at 50 both the position and tilt of the individually controllable element 20 will change (as shown in FIG. 5C).

In one example, prior to the use of the electrodes shown in FIG. 8 for exposure of a substrate W, their use can be calibrated using an optical sensor and the results stored in a memory portion of controller 25 (FIG. 7).

Figure 9:
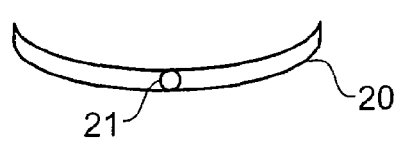

FIG. 9 shows the individually controllable elements 20 in an example when one or more of the individually controllable elements 20 are not completely flat. For example, shaped as a cup, as shown in FIG. 9. The edges of the individually controllable elements often curl towards the incoming radiation beam—so called "cupping". This is caused by stresses in the top layers of the individually controllable elements as a result of processing of the individually controllable elements. This results in a change in the reflection from the individually controllable element 20 concerned. To compensate for this the position of the individually controllable element 20 could be adjusted.

Figure 10:
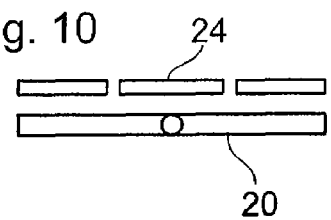

FIG. 10 shows an alternative embodiment to the embodiment shown in FIG. 8, in which a further electrode 24 is used. To compensate for the cupping the electrode attracts the individually controllable element 20. Due to the stiffness of the hinge 21 it can sometimes be difficult to adjust the position of the individually controllable element.

Figure 11:
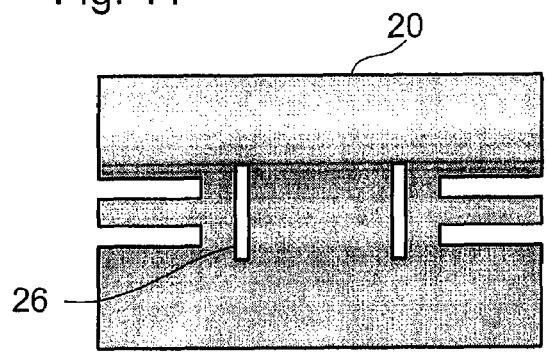

FIG. 11 shows an embodiment in which the stiffness in the direction of the hinge 21 could be reduced by cutting out portions of the hinge.

In one example, the amount by which the position of an individually controllable element needs to be adjusted as a result of a certain degree of cupping is stored in the controller 25 so the appropriate values can be applied when necessary. Furthermore, the amount of cupping can vary depending on the tilt of the individually controllable element. The amount by which the cupping varies according to the tilt can also be calibrated and stored in the controller 25.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
an illumination system configured to condition a radiation beam;
a first patterning array in a plurality of patterning arrays, the first patterning array comprising an array of individually controllable elements configured to modulate the radiation beam and an adjusting device configured to individually adjust a linear position and tilt of each of the individually controllable elements; and
a projection system configured to project the modulated beam onto a target portion of a substrate.

2. The lithographic apparatus of claim 1, wherein the linear position of the individually controllable elements is adjustable in a direction perpendicular to a plane in which the array of individually controllable elements lies.

3. The lithographic apparatus of claim 1, wherein the adjusting device is configured to adjust within a range of linear position adjustments of at least a wavelength $\lambda$ of the beam of radiation.

4. The lithographic apparatus of claim 1, wherein the adjusting device is configured to tilt within an angle range of at least $3\lambda/2L$ rad, wherein L is a length of the individually controllable element and $\lambda$ is a wavelength of the beam of radiation.

5. The lithographic apparatus of claim 1, wherein the adjusting device is configured to simultaneously adjust a linear position within a range of $\lambda$, a wavelength of the beam of radiation, and to adjust the tilt over an angle range of $\lambda/L$ rad.

6. The lithographic apparatus of claim 1 wherein a single control signal is configured to control the adjusting device, such as to maximize a range of intensities generated by each of the individually controllable elements.

7. The lithographic apparatus of claim 1, wherein:
each of the individually controllable elements comprise a hinge line that lies in a plane of the individually controllable element, the hinge line dividing the individually controllable element into two parts; and
the lithographic apparatus further comprises two electrodes, wherein each of the electrodes is configured to adjust the tilt of the individually controllable element over a range of at least three values and each of the electrodes is arranged opposite from a different part of each of the individually controllable element.

8. The lithographic apparatus of claim 7, wherein the two electrodes are positioned opposite from a same face of the individually controllable element.

9. The lithographic apparatus of claim 7, further comprising:
a memory configured to store compensation values applied to the adjusting device, wherein the compensation values are used to compensate for each degree of non-planarity of the individually controllable element by changing the linear position of the individually controllable element using the electrodes.

10. The lithographic apparatus of claim 1, wherein at least one of the individually controllable elements comprises a hinge line in a plane of the individually controllable element, a portion of the individually controllable element removed along the hinge line.

11. The lithographic apparatus of claim 1, wherein:
each of the individually controllable elements comprises a hinge in a plane of the individually controllable element; and
the lithographic apparatus further comprises an electrode configured to control a position of the hinge.

12. The lithographic apparatus of claim 1, further comprising two electrodes, wherein at least one of the electrodes is configured to adjust the tilt of each of the individually controllable elements over a range of at least three values, and each electrode is arranged opposite from a different part of each of the individually controllable elements.

13. The lithographic apparatus of claim 1, wherein:
each of the individually controllable elements comprise a hinge line in a plane of the individually controllable element, the hinge line dividing the individually controllable element into two parts; and
the lithographic apparatus further comprises two electrodes, each electrode configured to adjust the tilt of each of the individually controllable elements over a range of at least three values, and each electrode arranged opposite from a different part of each of the individually controllable elements.

14. A patterning array, comprising:
a first patterning array in a plurality of patterning arrays, the first patterning array comprising an array of individually controllable elements configured to modulate a radiation beam; and
an adjusting device configured to individually adjust a linear position and tilt of each of the individually controllable elements.

15. The patterning array of claim 14, wherein:
each of the individually controllable elements comprise a hinge line in a plane of the individually controllable element, the hinge line dividing the individually controllable element into two parts; and
the adjusting device further comprises two electrodes, wherein each electrode is configured to adjust the tilt of each of the individually controllable element over a range of at least three values, and each electrode is arranged opposite from a different part of each of the individually controllable element.

16. The patterning array of claim 14, wherein at least one of the individually controllable elements comprise a hinge line in a plane of the individually controllable element, a portion of the individually controllable element removed along the hinge line.

17. A device manufacturing method, comprising:
modulating a beam of radiation using a first patterning array in a plurality of patterning arrays, the first patterning array comprising an array of individually controllable elements;
projecting the modulated beam of radiation onto a substrate; and
individually adjusting a linear position and tilt of each of the individually controllable elements.

18. The method of claim 17, wherein the position and tilt of each of the individually controllable elements are adjusted using two electrodes, each of the electrodes operable over a range of values.

19. The lithographic apparatus of claim 1, wherein the adjusting device is configured to simultaneously adjust the linear position and tilt of each of the individually controllable elements.

* * * * *